United States Patent
Iwai (10) Patent No.: US 7,973,458 B2
(45) Date of Patent: Jul. 5, 2011

(54) PIEZOELECTRIC VIBRATING PIECES HAVING PROGRESSIVELY NARROWED VIBRATING ARMS

(75) Inventor: Yu Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 14 days.

(21) Appl. No.: 12/580,159

(22) Filed: Oct. 15, 2009

(65) Prior Publication Data

US 2010/0096953 A1    Apr. 22, 2010

(30) Foreign Application Priority Data

Oct. 16, 2008   (JP) .................... 2008-267806

(51) Int. Cl.
*H03H 9/19* (2006.01)
*H03H 9/21* (2006.01)

(52) U.S. Cl. ........................................ 310/370
(58) Field of Classification Search .......... 310/370
See application file for complete search history.

(56) References Cited

U.S. PATENT DOCUMENTS

| | | | | |
|---|---|---|---|---|
| 2,247,960 A | * | 7/1941 | Michaels | 84/409 |
| 3,697,766 A | * | 10/1972 | Ganter et al. | 310/348 |
| 3,697,789 A | * | 10/1972 | Kato et al. | 310/344 |
| 7,368,861 B2 | * | 5/2008 | Tanaya | 310/370 |
| 7,521,846 B2 | * | 4/2009 | Tanaya | 310/370 |
| 7,523,537 B1 | * | 4/2009 | Knowles et al. | 29/594 |
| 7,550,905 B2 | * | 6/2009 | Tanaya | 310/370 |
| 7,626,318 B2 | * | 12/2009 | Dalla Piazza et al. | 310/370 |
| 2009/0218917 A1 | * | 9/2009 | Tanaya | 310/370 |

FOREIGN PATENT DOCUMENTS

| | | | |
|---|---|---|---|
| JP | 54037488 A | * | 3/1979 |
| JP | 2006094154 A | * | 4/2006 |
| JP | 2007-096900 | | 4/2007 |
| JP | 2009027711 A | * | 2/2009 |
| JP | 2009060347 A | * | 3/2009 |

* cited by examiner

*Primary Examiner* — J. SanMartin
(74) *Attorney, Agent, or Firm* — Klarquist Sparkman, LLP (57) ABSTRACT

An exemplary piezoelectric vibrating piece comprises a base formed of a piezoelectric material; and a pair of vibrating arms extending from one end of the base in a designated direction; wherein the vibrating arm comprises an arm portion in which only the inner side slopes as it becomes narrower to the distal end and a hammer-head portion that is formed wider than the arm portion at the distal end of the vibrating arms.

20 Claims, 6 Drawing Sheets

Prior Art

PIEZOELECTRIC VIBRATING PIECES HAVING PROGRESSIVELY NARROWED VIBRATING ARMS

CROSS-REFERENCE TO RELATED APPLICATION

This application claims priority to and the benefit of Japan Patent Application No. 2008-267806, filed on Oct. 16, 2008, in the Japan Patent Office, the disclosure of which is incorporated herein by reference in its entirety.

FIELD

This disclosure pertains to, inter alia, a piezoelectric vibrating piece, methods of making a piezoelectric vibrating piece, and a piezoelectric device accommodating the piezoelectric vibrating piece.

DESCRIPTION OF THE RELATED ART

Various types of clocks, home electric appliances, and consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating device, or an IC chip as a clock source for addition to and use by an electronic circuit of the apparatus. In other apparatus, piezoelectric timing devices such as real-time clock modules are widely used.

Especially nowadays, piezoelectric vibrating devices must be increasingly miniaturized and/or provided with a thinner or lower profile so as to be correspondingly accommodated in electronic devices that likewise are miniaturized and/or provided with a lower profile. Also, modern piezoelectric devices desirably exhibit a suitably low CI (crystal impedance) value, high quality, and stability. One type of tuning-fork type piezoelectric vibrating device having vibrating arms has been developed that exhibits low CI. For such a device a tuning-fork type piezoelectric vibrating piece having a shorter body and supporting arms has been developed.

Note that in order to meet the demand of miniaturization, the above-mentioned tuning-fork type piezoelectric vibrating pieces have been configured to have shorter vibrating arms. In this case, when the length of vibrating arm is L and the width of vibrating arm is W, the frequency F of the piezoelectric vibrating piece is proportional to $W/L^2$. Therefore, if the length L becomes shorter, the frequency becomes higher, which is undesirable. In general, in order to lower the frequency one can reduce the width of vibrating arm, but vibrating arms having narrower widths are not easily fabricated, and rigidity degrades and flexure vibration becomes unstable as well.

Figure 6:
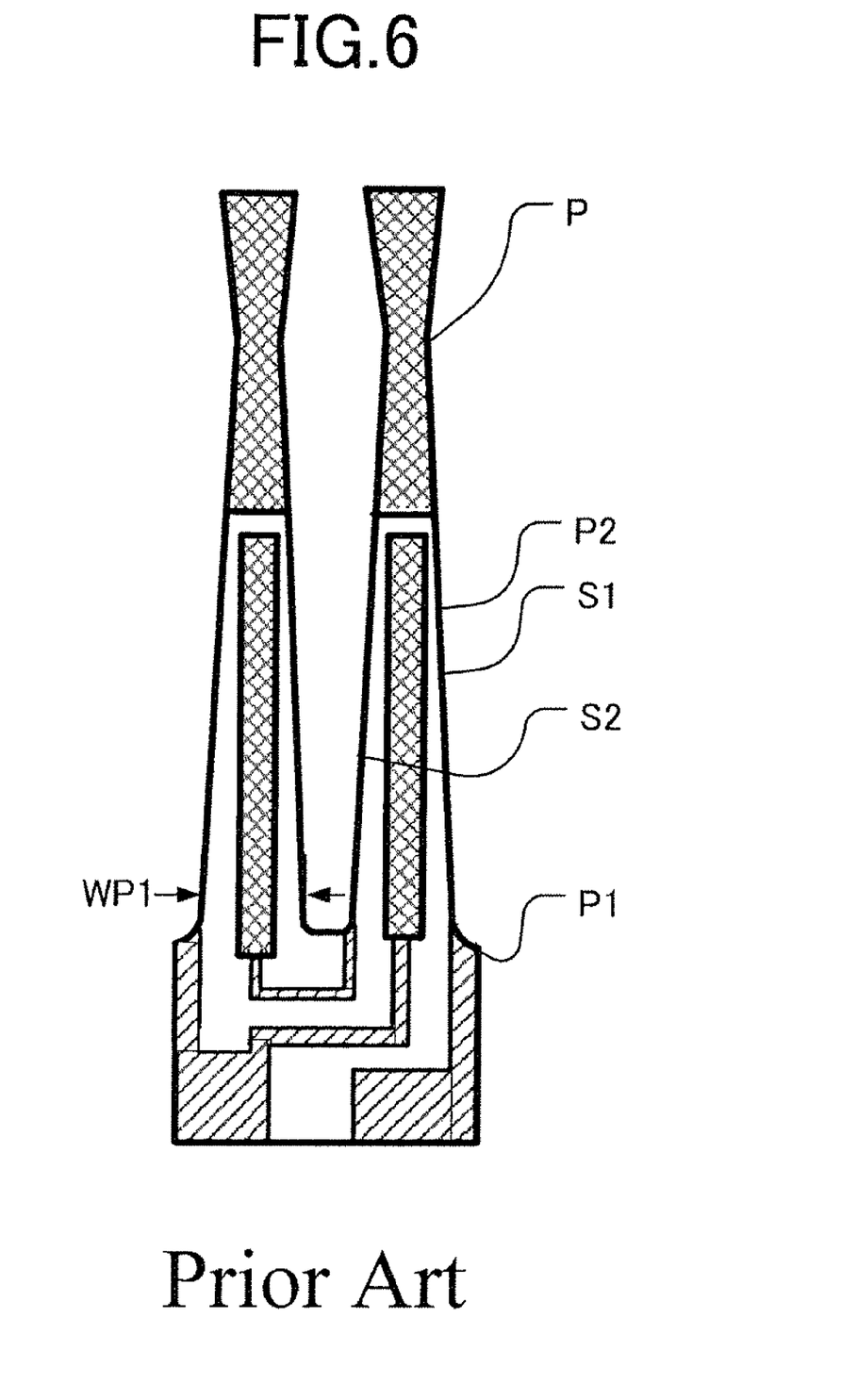
FIG. 6 is a schematic view of a tuning-fork type piezoelectric vibrating piece of prior art.

Thus, in order to solve these problems, in U.S. Pat. No. 7,368,861 a piezoelectric vibrating piece that enables keeping the CI value low and achieving stable flexure vibration under miniaturization is provided. As shown in FIG. 6, vibrating arms of the piezoelectric vibrating piece have a first narrow portion P1, which suddenly narrows at a root portion toward the distal end, a second narrower portion P2, which gradually narrows from the end of narrow portion P1 to the distal end, and a change point P, which conversely become wider toward the distal end.

Note that in prior art, the piezoelectric vibrating piece is fixed to a package by adhesive. However, residual stress due to differences in the coefficient of linear expansion of material of the piezoelectric vibrating piece and material of the package impacts the flexure vibration of vibrating arms. Stress changes caused by changes in environmental temperature and/or physical impacts from dropping the package also affect performance of the vibrating arms.

Therefore, in order to solve these problems, in Japan Unexamined Patent Application No. 2007-96900 ("'96900 application"), a piezoelectric vibrating piece that is capable of maintaining high reliability over changes in temperature is provided. The piezoelectric vibrating piece has a first connecting portion around a base-end of supporting arms and a second connecting portion at the distal end, also in between the first connecting portion and the base cuttings, which become wider in the width direction in between the first and second connecting portion cuttings are formed and those cuttings prevent interrelated influence between the connecting portions and the vibrating arms.

DESCRIPTION OF THE RELATED ART

However, as shown in FIG. 6, both side surfaces S1 and S2 of a second narrow portion P2 slope to form a narrower width at the distal end. Note that if the width of a groove formed on the vibrating arms is constant, the width of a piezoelectric vibrating piece is limited by the maximum width WP1 of the piece. Thus, a piezoelectric vibrating piece that can be miniaturized and increase its rigidity, even if the width of groove is constant, is required.

In the '96900 application, two connecting portions are formed because between the connecting portions and the base portion and between two of the connecting portions, to prevent stress change caused by temperature change that interferes with the flexure vibration of the vibrating arms. However, forming those cuttings makes a manufacturing process complicated and the rigidity of the supporting arms becomes low. Thus, a piezoelectric device which can be manufactured with a less complicated process and which can enhance the rigidity of the supporting arms is required.

Piezoelectric vibrating pieces and piezoelectric devices that can be miniaturized while having increased rigidity, be easily manufactured, and prevent increasing of CI value are disclosed in the present application.

SUMMARY

A piezoelectric vibrating piece of a first aspect is comprised of a base formed of a piezoelectric material, and a pair of vibrating arms extending from one end of the base in a designated direction; wherein the vibrating arm comprises an arm portion in which only the inner side slopes as it becomes narrower to the distal end and a hammer-head portion, which is formed wider than the arm portion at the distal end of the vibrating arms.

The width of the piezoelectric vibrating piece of the first aspect can be narrowed because of the arm portion, which only slopes its inner side surface. Thus, the amount of finished product per unit area can be increased by saving wafers with such a configuration and cost can also be reduced. The hammer-head portion formed at the distal end of the arm portion enables a lower frequency by moderating the vibration of the vibrating arms. The CI value does not get degraded because of increasing frequency even if the width of vibrating arms becomes additionally narrower.

In a piezoelectric vibrating piece of a second aspect, the hammer-head portion has a designated same width in a designated direction. According to such a configuration, the hammer-head portion having a short profile enables moderation of the oscillation of the vibrating arms. That is, it enables lower frequency operation and prevents degradation of CI value. Therefore, the vibrating arms can be shortened without changing the characteristics of the piezoelectric vibrating piece.

In a piezoelectric vibrating piece of a third aspect, the width of a hammer-head portion is increased to 1 micrometer to 100 micrometers wider than the minimum width of the arm portion and the inner side of the arm portion is sloped to be 5% to 20% narrower than the maximum width of the arm portion. By setting the width of the vibrating arms as above, the piezoelectric vibrating piece can be miniaturized optimally, stable frequency can be obtained, and CI value can be improved.

A piezoelectric vibrating piece of a fourth aspect is further comprises a pair of supporting arms extending from one end of the base portion in the designated direction at both outer sides of the vibrating arms, wherein the supporting arm has three connecting portions along the designated direction and one connecting portion adjacent to the base portion that is arranged at a position more than 15% away from the root portion in total length of the vibrating arm, and the other two connecting portions are arranged evenly. It is preferable that three of the connecting portions are arranged evenly.

Evenly arranging three of the connecting portions on the supporting arms can reduce the amount of adhesive applied and compensate for changes in characteristics caused by temperature changes and/or physical impacts from dropping the package. Further, cuttings do not need to be formed, so the manufacturing steps can be easier and rigidity of the supporting arms can be increased.

A piezoelectric vibrating piece of a fifth aspect is further comprised of supporting root portions formed in between one of the pair of vibrating arms and one of the pair of supporting arms, and a vibrating root portion formed between the pair of vibrating arms and having the same shape and size of the supporting root portion.

Because of the similar shapes and sizes of the supporting root portions and vibrating root portion, etchant flows evenly to the root portions and a balanced etching process can be conducted. Thus, the CI value can be improved and oscillation leakage can be lowered.

A piezoelectric vibrating piece of a sixth aspect includes a pair of supporting arms, the supporting root portion, the pair of vibrating arms, and the vibrating root portion that are formed symmetric with a center line between the pair of vibrating arms. Thus, etchant flows evenly to the root portions and a balanced etching process can be conducted. Also, increasing of CI value can be improved and oscillation leakage can be lowered.

A piezoelectric device of a seventh aspect is further comprised of the piezoelectric vibrating piece of any of claims 1 to 7 including a lid covering the piezoelectric vibrating piece, and a base to which the supporting arms are connected and also support the piezoelectric vibrating piece.

By configuring the piezoelectric vibrating piece according to any of first through sixth aspects, the piezoelectric device can be stable despite miniaturization and also be able to cope with temperature changes and/or physical impacts from dropping the package.

A piezoelectric vibrating piece of the disclosed technology enables reducing of CI value even if the pieces are miniaturized enables reduction in oscillation leakage, and prevents changing characteristics caused by temperature changes and/or physical impacts from dropping the package. Further, the total width of a piezoelectric vibrating piece can be narrower and the number of pieces per unit area can be increased, reducing costs. Also, piezoelectric devices using such piezoelectric vibrating pieces are able to meet the needs of miniaturization and stabilization.

DETAILED DESCRIPTION

Multiple embodiments of the present invention will be explained with figures, but it is not limited by those figures. In these embodiments, a tuning-fork type piezoelectric vibrating piece is used as one example. A tuning-fork type piezoelectric vibrating piece of certain disclosed embodiments is a vibrating piece oscillating at a frequency of 32.768 kHz and a length in the Y-axis direction of about 1.45 mm, a width in X-direction of 0.5 mm, and a thickness in the Z-direction of 0.1 mm.

First Embodiment

Figure 1A:
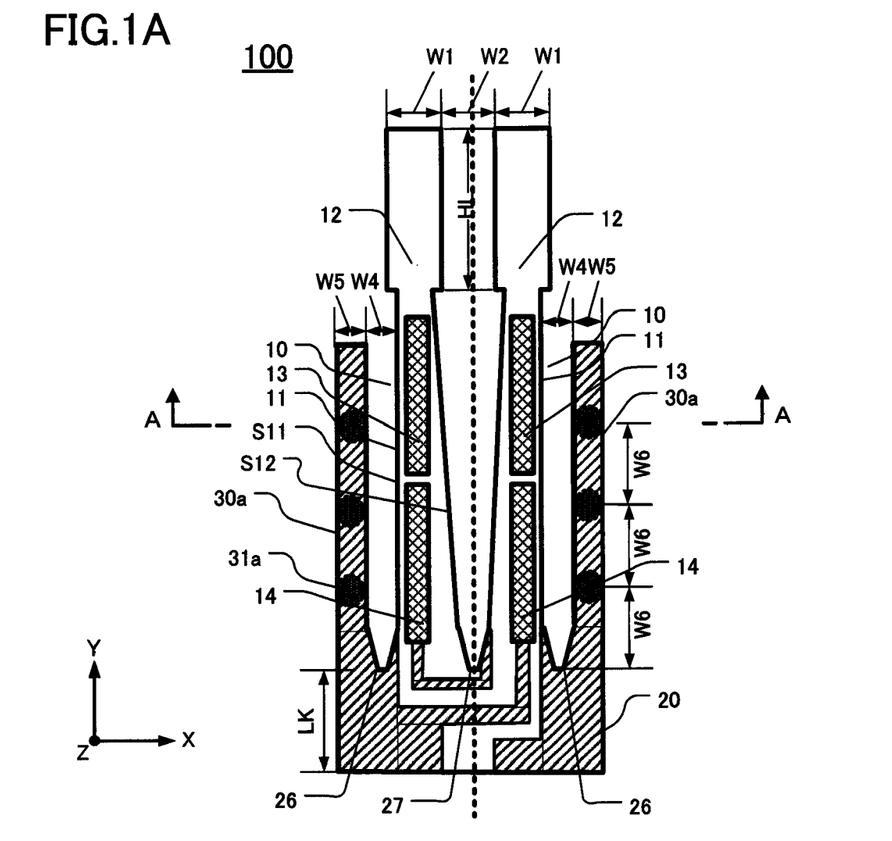
FIG. 1A is a top view of a first tuning-fork type piezoelectric vibrating piece 100 of present invention.
Figure 1B:
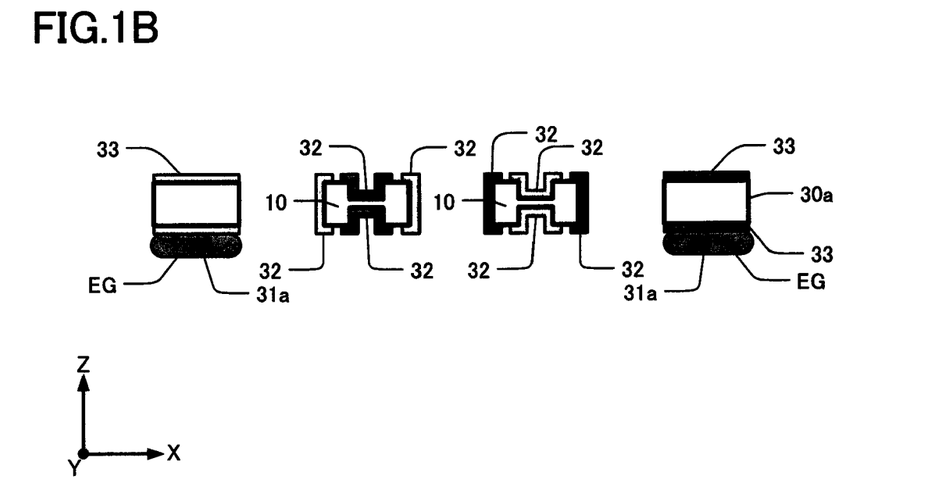
FIG. 1B is a cross-sectional view taken along the line A-A of FIG. 1A.

FIG. 1A is a top view of a first tuning-fork type piezoelectric vibrating piece 100 of present invention and FIG. 1B is a cross-sectional view taken along the line A-A of FIG. 1A. As shown in FIG. 1A, the first tuning-fork type piezoelectric vibrating piece comprises a pair of vibrating arms 10, which extend in the Y-direction and a base portion 20 comprising a piezoelectric material formed uniformly with the vibrating arms 10. The piece 100 further comprises a pair of supporting arms that extend in the Y-direction at both outer sides of the vibrating arms. The length LK of the base portion 20 is about 0.15 mm and the length of the pair of vibrating arms 10 is about 1.3 mm.

The pair of vibrating arms 10 extends parallel in the Y-direction from the base 20 respectively. Respective grooves 13 and 14 are formed on each of the upper and lower surfaces of each vibrating arm 10, yielding a total of four grooves per pair of vibrating arms 10. As shown in FIG. 1B, a cross-section of a vibrating arm 10 having grooves 13 and 14 on the upper and lower surfaces has a substantially H-shaped transverse profile. There would be the same effect if one groove or a plurality of grooves are formed although as shown here, two grooves are formed on one vibrating arm.

The root portions of pair of vibrating arms 10 are formed wide in the X-direction. The oscillation of vibrating arms transfers stress concentrated around the root portions and oscillation leakage to the base portion 20 can be reduced.

Extending from the base position 20 are arm portions 10 and hammer-head portions 12. The grooves 13 and 14 are formed on the arm portions 11.

Figure 2A:
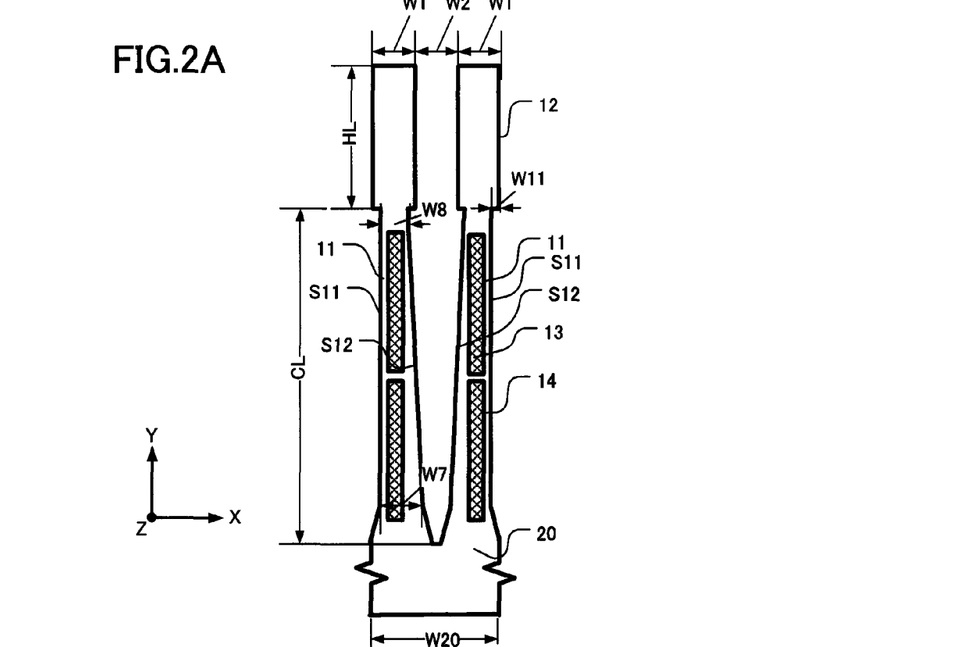
FIG. 2A is a schematic view of vibrating arms with a simplified configuration of a base portion of the first tuning-fork type piezoelectric vibrating piece 100 of an embodiment of the present invention.

The arm portions 11 have a vertical surface S11 which is nearly parallel to the Y-direction and taper surfaces S12 which gradually slope as the width of vibrating arms 10 is decreased from the root portion of vibrating arms 10 to the distal end. FIG. 2A is a schematic view of vibrating arms with a simplified configuration of a base portion of the first tuning-fork type piezoelectric vibrating piece 100 of one embodiment. As shown in FIG. 2A, the width W7 of arm portion 11 near the root portion is wider that the width W8 of arm portion 11 near the distal end.

In this embodiment, it is preferable that the minimum width of W8 is 5% to 20% narrower than the maximum width of W7. This enables securing the rigidity of vibrating arms 10, prevents degradation of CI value by unnecessary oscillating modes, and controls frequency increases caused by shortening the length of vibrating arms 10 efficiently. It is also preferable that the maximum width W7 of arm portion 11 is within the range of 50 to 100 micrometers. Also, the minimum width W8 is preferably within the range of 40 to 95 micrometers.

Figure 2B:
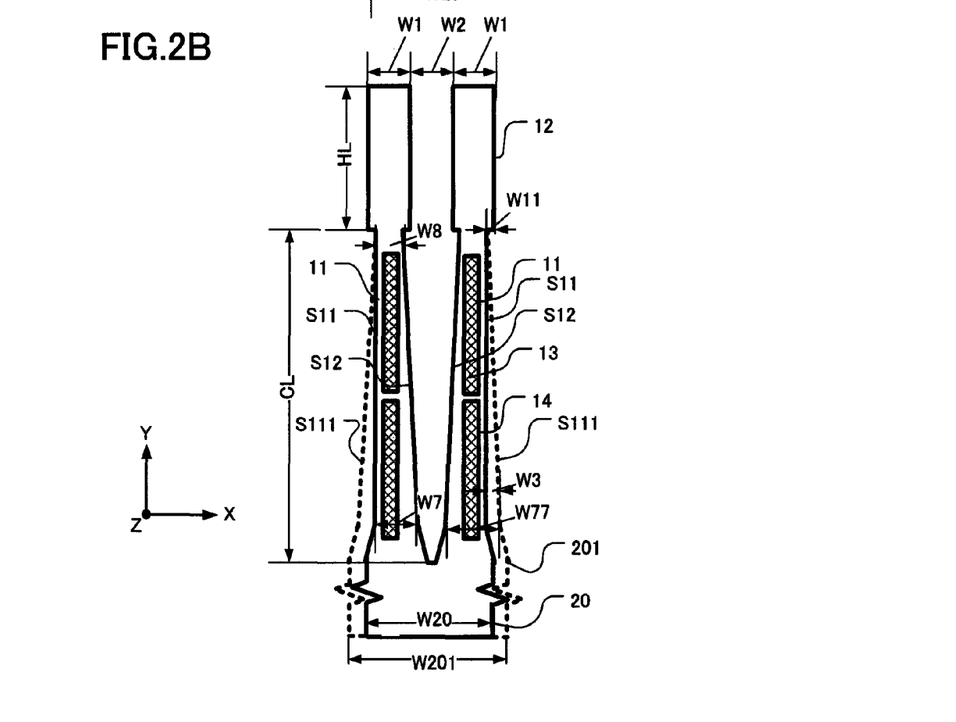
FIG. 2B is a schematic view showing the relationships of widths of a piezoelectric vibrating piece of the prior art and an embodiment of the present invention.

FIG. 2B is a schematic view showing the relationship between widths of a piezoelectric vibrating piece of the prior art and an embodiment of the present invention. In FIG. 2B, the arm portion comprising the vertical surface S11 and the taper surface S12 is the arm portion of the present embodiment and the arm portion comprising the taper surface S111, which is illustrated with dotted lines and slopes at the outer side and the taper surface 12 is the arm portion of the prior art. The base portion 20 illustrated with solid lines is the base portion of a piezoelectric vibrating piece having arm portions of the present embodiments and the base portion 201 illustrated with dotted lines is the base portion of piezoelectric vibrating piece having arm portions of the prior art.

As shown in FIG. 2B, at the arm portions, the width of the arm portions of the present embodiment is W7 and of the prior art is W77. As seen from the FIG. 2B, the width W77 of the prior art is wider than the width W7 of the present embodiment. If the angle of gradient of the taper surface becomes larger, the width W3 becomes larger as well.

As shown in FIGS. 2A and 2B, the width of the base portion 20 of the piezoelectric vibrating piece having arm portions of the present embodiment are indicated W20 and those widths of the prior art are indicated W201. When the same sizes of grooves and lengths of arms are formed in the present embodiment, the width W77 of the prior art is wider than the width W7 of present embodiment. The width W201 of the base portion 201 is also wider than the width W20 of the base portion 20. That is, for the piezoelectric device having the same characteristics, based on this embodiment, the width of the piezoelectric vibrating piece 100 can be narrower than the prior art. Therefore, a more miniaturized piezoelectric vibrating piece can be obtained from the same size wafer by following this embodiment. Thus, the manufacturing cost can be reduced because the numbers of vibrating pieces cut out from one crystal wafer can be increased.

The width of a hammer-head portion 12 of the present embodiment is increased by 1 to 10 micrometers than the minimum width at the distal end of arm portion 11. In FIGS. 2A and 2B, the width W1 of a hammer-head portion 12 is about 50 micrometers, and the length HL is about 300 micrometers. Note that the width W11 of the hammer-head portion 12 adjacent to the arm portion 11, which is suddenly increased by about 6 micrometers. In order to avoid collisions of the hammer-head portions 12 with each other, a space W2 between the hammer-head portions 12 is designed with the same width as W1.

The hammer-head portion 12 formed at the distal end of arm portion 11 enables lower frequencies by moderating the vibration of the vibrating arms 10. Especially, as shown in FIGS. 2A and 2B, the hammer-head portion has the same designated width in Y-direction. Such configuration, compared to prior art, enables suppression of oscillation of the vibrating arms 10 with shorter length and also allows lower frequency. Thus, the length of the vibrating arm 10 can be shortened without changing its characteristics. By controlling the width W1 and length HL of the hammer-head portion 12 and the length CL of arm portion 11, increasing CI value can be controlled and generation of second harmonic oscillation can also be prevented. Thus, the piece can oscillate at a stable fundamental harmonic.

A base 20 of the first tuning-fork type piezoelectric vibrating piece 100 has a substantially "board" shape. In order to shorten the entire length of the first tuning-fork piezoelectric vibrating piece 100, the length of the base 20 is preferably as short as possible. However, with a short length LK, the oscillation of vibrating arm 10 may be transmitted to the exterior of the package as oscillation leakage, and also the piece 100 may be affected by external temperature changes and/or physical impact from dropping the package. Therefore in the present embodiment, by forming supporting arms 30 to the first tuning-fork type piezoelectric vibrating piece 100, oscillation leakage of vibrating arms 10 or the effect of external temperature change can be reduced.

That is, as shown in FIG. 1A, the base 20 of first tuning-fork type piezoelectric vibrating piece 100 comprises a supporting arm 30a at each end respectively. On each supporting arm 30a, evenly arranged are three connecting portions 31 formed respectively to connect the package PKG. The root portions of supporting arms 30a are formed wider at the inner sides and are formed parallel at the outer sides. By forming the inner sides of supporting arms 30a wider at the root portion, it effectively prevents changes in stress condition at the connecting portion caused by temperature change that interferes with the flexure vibration of the vibrating arms.

Further, three of the connecting portions 31a connecting the first tuning-fork type piezoelectric vibrating piece 100 and the package are evenly arranged on the supporting arms 30a so that the amount of adhesive applied at each part can be reduced while maintaining adhesive strength. Also, interface change between the adhesive and an element caused by temperature changes and/or physical impacts from dropping the package can be reduced and oscillation leakage and effects of external changes can be lowered. Moreover, changes of frequency and CI value can be controlled and reliability improved even over temperature changes. Because of forming a slope on one side of the supporting arms 30 and also of evenly arranged three connecting portions 31, the amount of adhesive can be reduced and the width of the supporting arms 30 can be narrower. Thus, the manufacturing cost can be reduced because the numbers of vibrating pieces cut out from one crystal wafer can be increased.

In this embodiment, although three connecting portions are formed, four of them can also be formed instead.

In prior art, cutting portions are formed along the X-direction adjacent to the connecting portions of vibrating arms in order to prevent changes of stress condition at connecting portions caused by temperature changes that interfere with the flexure vibration of vibrating arms. However, as shown in FIG. 1A, because three of the bonding portions are formed on the vibrating arms of a present embodiment, the above-mentioned cutting portions do not need to be configured, so the manufacturing becomes easier, and rigidity of the vibrating arms can be improved.

Electrically-conductive adhesive can be applied on the connecting portions. The adhesive is comprised of conductive filler such as silver, nickel, or carbon, with epoxy, silicone, or polyurethane resin as a binder.

As shown in FIG. 1A, a root portion 27 for vibrating arms having a U-shape with straight lines is formed in between a pair of vibrating arms 10. Also, supporting root portions 16 having the same shape and size as the root portion 27 are formed in between the vibrating arms 10 and the supporting arms 30a respectively. Because of this, the anomalous etch zones due to effect of anisotropy form the same shapes and the configuration of the piece becomes balanced.

As shown in FIG. 1A, the width W5 of supporting arm 30a is the same width as the width W4 between the supporting arm 30a and the vibrating arm 10. The first tuning-fork type piezoelectric vibrating piece 100 is formed symmetric with the dotted line shown in FIG. 1A. That is, the supporting arms 30a positioned on both sides respectively, the root portions 26 for the supporting arms, the vibrating arms 10, and a half portion of the vibrating root portion 27 are formed symmetric with the dotted line as a center. Because of this, etchant flows evenly in the etching process and a well-balanced first tuning-fork type piezoelectric vibrating piece 100 can be formed. Because of this, stable oscillation can be provided and the Q value can be improved as well.

The length of the supporting arms 30a are shorter than of the vibrating arms 10, and metal films are formed on the distal ends of the vibrating arms 10 when electrodes are formed. The metal films act as weights for the vibrating arms to oscillate stably. The metal films are also formed for readily controlling frequency of the first tuning-fork type piezoelectric vibrating piece 100 mounted as a piezoelectric device. The profile and grooves 13 and 14 of first tuning-fork type piezoelectric vibrating piece 100 is formed by photolithography etching. The forming process of the profile and grooves 13 and 14 will be described below.

Formation of Profile

The profile outlines of multiple tuning-fork type crystal vibrating pieces 100 are typically formed simultaneously on a circular- or rectangular-shaped crystal wafer. First, the profile outlines are defined by forming on the surface of the wafer a patterned mask made of a corrosion-resistant film. The mask defines openings that are vulnerable to etching. Etching is conducted using, for example, a fluorinated acid solution that etches the crystal exposed in the openings of the mask. The corrosion-resistant film on the mask is a metal film deposited on a chrome sub-film. Etching is desirably by wet-etching. Etching conditions can be varied depending on density of the wafer, concentration of fluorinated acid, and etching temperature.

Formation of Grooves

After forming the outline profiles of the crystal vibrating pieces 100, grooves 13 and 14 are formed using a resist that is micro-lithographically patterned for forming the grooves on the vibrating arms 10. The resist is applied to form respective walls that sandwich each desired groove region. The corrosion-resistant film of the mask is left in areas where the grooves 13 and 14 are not formed. Then, wet-etching is performed on both the upper and lower surfaces of the vibrating arms 10, with etching conditions being substantially the same as during wet-etching performed to form the outline profiles. The depth of the grooves 13 and 14 is normally 30 to 45 percent of the thickness of the vibrating arms.

Note that either or both the wet-etching steps discussed above (for forming profile outlines and for forming grooves) can alternatively be performed by dry-etching instead of wet-etching. For dry-etching, metal masks are formed on the crystal wafer to define the profile outline of the crystal vibrating piece 100. Then, another respective metal mask is formed on the crystal wafer surface to define the grooves. In such a condition, the crystal wafer is placed into a chamber (not shown), and etching gas is delivered to the chamber that has been evacuated to a pre-designated degree of vacuum to form an etching plasma. The etching plasma is a dry-etchant.

For example, a source of Freon (® DuPont) gas and a source of oxygen gas can be connected to a chamber that is also connected to a vacuum source by an evacuation conduit. Via the conduit, the vacuum source establishes a predetermined vacuum state in the chamber. Meanwhile, Freon gas and oxygen gas are delivered to the chamber to establish desired concentrations of these gases in the subatmospheric environment in the chamber. At the desired concentrations of gases and vacuum level, a direct-current voltage is discharged in the chamber to produce a plasma. The plasma ionizes the molecules of the gases, and the ions bombard the regions of the piezoelectric vibrating piece not covered by the metal mask. This bombardment ablates the piezoelectric material, resulting in dry-etching.

Forming Electrodes

In FIG. 1A, electrodes comprise excitation electrodes 32 and base electrodes 33. The excitation electrodes 32 are formed on the upper and lower surfaces of the vibrating arms 10, as shown in FIG. 1B. The connecting portions 31a formed on the supporting arms 30a are mounted on the electrically-conductive adhesive EG. The excitation electrodes 32 and the base electrodes 33 each have a two-layer structure in which a layer of Au is formed on a sub-layer of Ni, for example.

To form an electrode, metal layers intended to constitute the electrode are formed on the entire surfaces of the arms by vacuum deposition or sputtering. The electrodes are patterned by photolithography using a resist to define denuded areas where electrodes are not to be formed. Then, electrodes (as well as the weights on the distal ends of the vibrating arms) are formed on the front and rear surfaces of the vibrating arms 10 by sputtering or vacuum deposition. The weights are used for fine adjustment of the vibration frequency of the vibrating arms 10.

The following embodiment omits an illustration and discussion of electrodes because the electrodes are formed in the same way as described above.

Fabrication of Piezoelectric Device

Figure 3A:
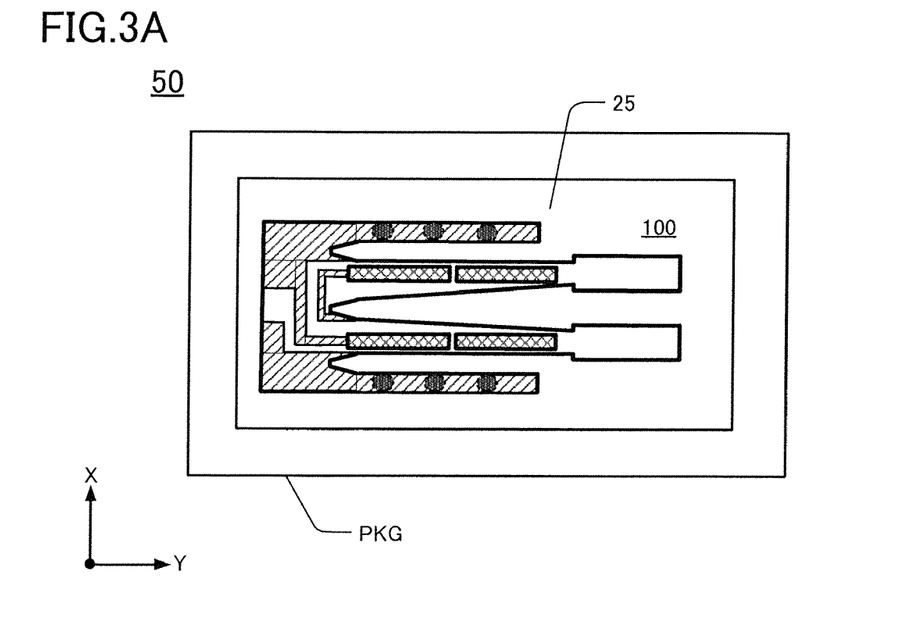
FIG. 3A is a top view of a piezoelectric device 50.
Figure 3B:
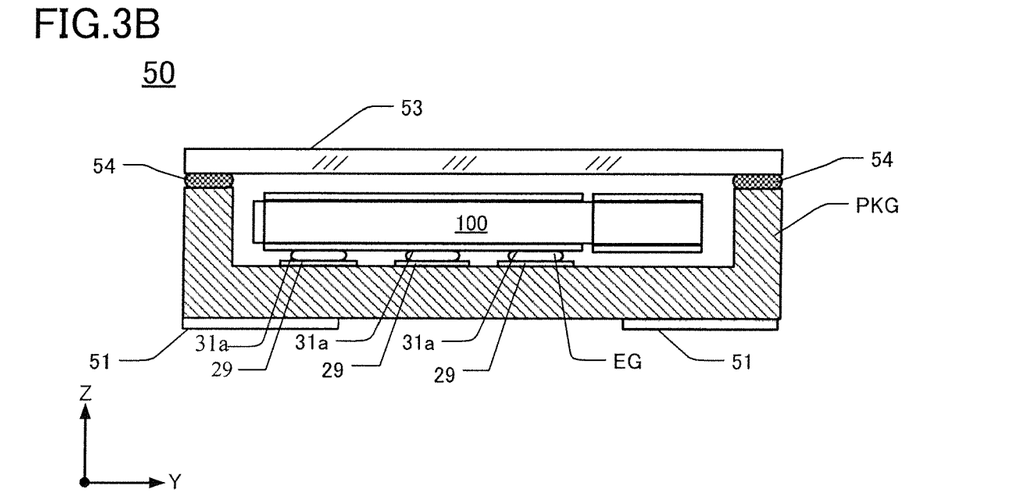
FIG. 3B is a cross-sectional schematic view of FIG. 3A.

FIG. 3A shows a schematic top view of the piezoelectric device 50, and FIG. 3B is a cross-sectional view of FIG. 3A. The piezoelectric device 50 is formed as follows. A tuning-fork type crystal vibrating piece 100, formed as described above, is placed into a package PKG that has a space. The crystal vibrating piece 100 is mounted to the package PKG. The package PKG is then placed in a vacuum chamber in which a lid 53 is placed on the package PKG and sealed to the package PKG using a sealing material 54. By forming the lid 53 of borosilicate glass, for example, or other suitable translucent material, the vibration frequency of the piezoelectric device 50 can be fine-tuned after sealing the package, using a trimming laser illuminated through the lid.

The package PKG is made of ceramic, formed by laminating a plurality of ceramic sheets together to form an open-box shape. The package PKG can be configured as a SMD (surface mount device) by placing external electrodes 51 on the under-surface of the package PKG.

The first tuning-fork type crystal vibrating piece 100 is mounted in the package PKG via the connecting portions 31a of the supporting arms 30a. For example, the connecting portions 31a can be mounted on respective units of electrically conductive adhesive EG applied to respective connecting electrodes 29 in the package PKG. After mounting the crystal vibrating piece, the electrically conductive adhesive is thermally cured in a curing furnace. The resulting full cure connects the connecting portion 31a and connecting electrode 29 in a conductive manner to the tuning-fork crystal vibrating piece 100 and to the package PKG. This connecting includes electrical connections to the external electrode 51 located outside the package.

Frequency adjustment of the piezoelectric device 50 is performed by a mass-reduction method. A laser light is irradiated onto the distal surfaces of the vibrating arms 10 on which "weight" metal layers have been formed. The laser light evaporates or sublimates a part of the metal weight material. The manufacture of the piezoelectric device 50 is complete upon performing a test of operational performance of the device.

By modifying the profile of vibrating arms 10 and supporting arms 30a of the first tuning-fork type piezoelectric vibrating piece 100, a piezoelectric device 50 having less of an increasing CI value and improved ability to absorb impact can be manufactured. Specific examples of profiles of vibrating arms and supporting arms that can prevent oscillation leakage and have improved ability to absorb impact will be described below in the second and third embodiments.

Second Embodiment

Figure 4:
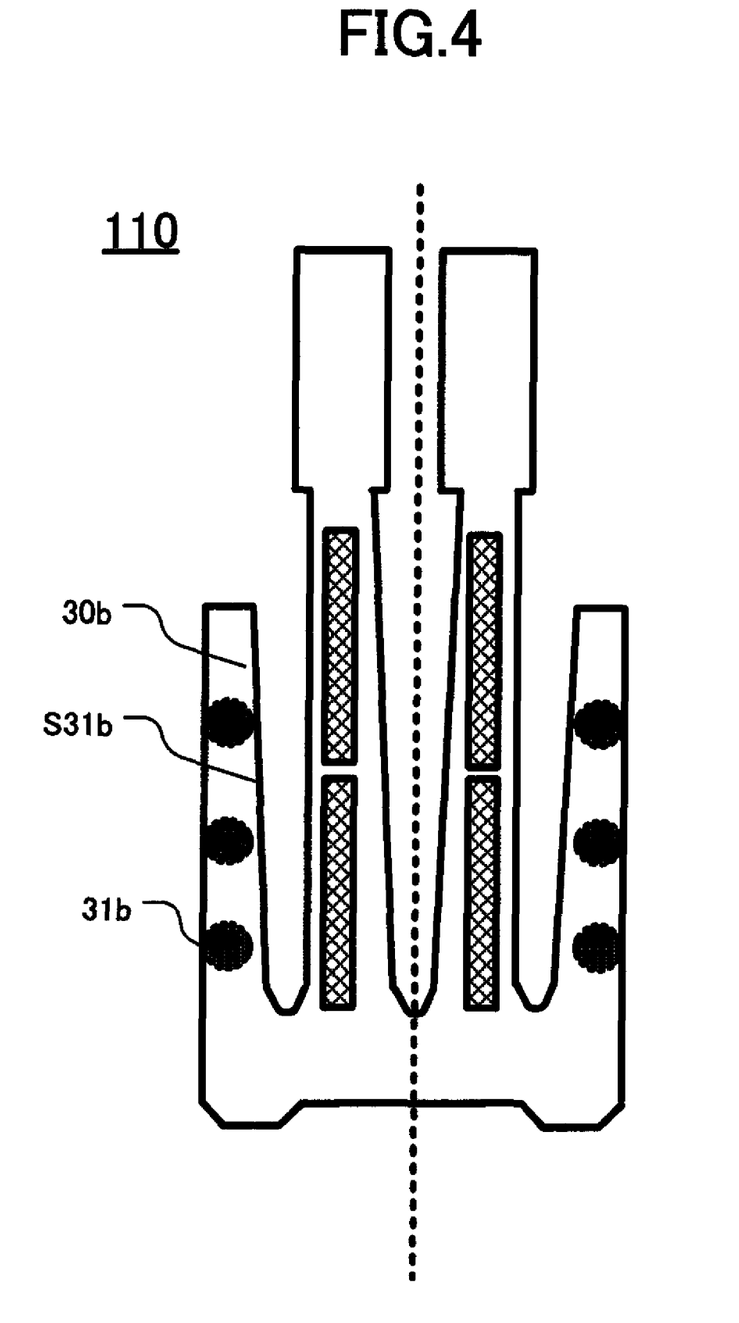
FIG. 4 is a schematic view of a second tuning-fork type piezoelectric vibrating piece 110 of a second embodiment.

FIG. 4 is a schematic view of a second tuning-fork type piezoelectric vibrating piece 110 that has less increasing of CI value, can reduce oscillation leakage, and has increased ability to absorb impact. This embodiment omits a discussion of configuration except supporting arms 31b because they are formed in the same way as described in the first embodiment. Electrodes as well as internal configuration of the base portion are not illustrated for convenience.

As shown in FIG. 4, the supporting arms 30b of a second piezoelectric vibrating piece of the second embodiment is differed from the supporting arms 30a of the first embodiment and the inner surfaces S31b of supporting arms 30b are sloped. This sloped shape can prevent the stress change of the connecting portion 31b by temperature effects on flexure vibration of the vibrating arms.

Note that in the first embodiment, the connecting portions 31a are evenly-arranged on the supporting arms 30a, but in this embodiment, the connecting portion 31b adjacent to the base portion is placed 15% away from the base with respect to the entire length of the supporting arm 30. The other two connecting portions 31b are arranged evenly on the rest of supporting arm 30b.

Note that the second piezoelectric vibrating piece 110 is also formed symmetric with the dotted center line. This can cope with characteristic change caused by oscillation impact or temperature change. Also, cutting portions are not needed so that manufacturing the pieces is easier and rigidity of the supporting arms is improved.

In the second embodiment, as well as the first embodiment, a piezoelectric device can be manufactured by controlling frequency after the second tuning-fork type piezoelectric vibrating piece 110 is contained in a package PKG.

Third Embodiment

Figure 5:
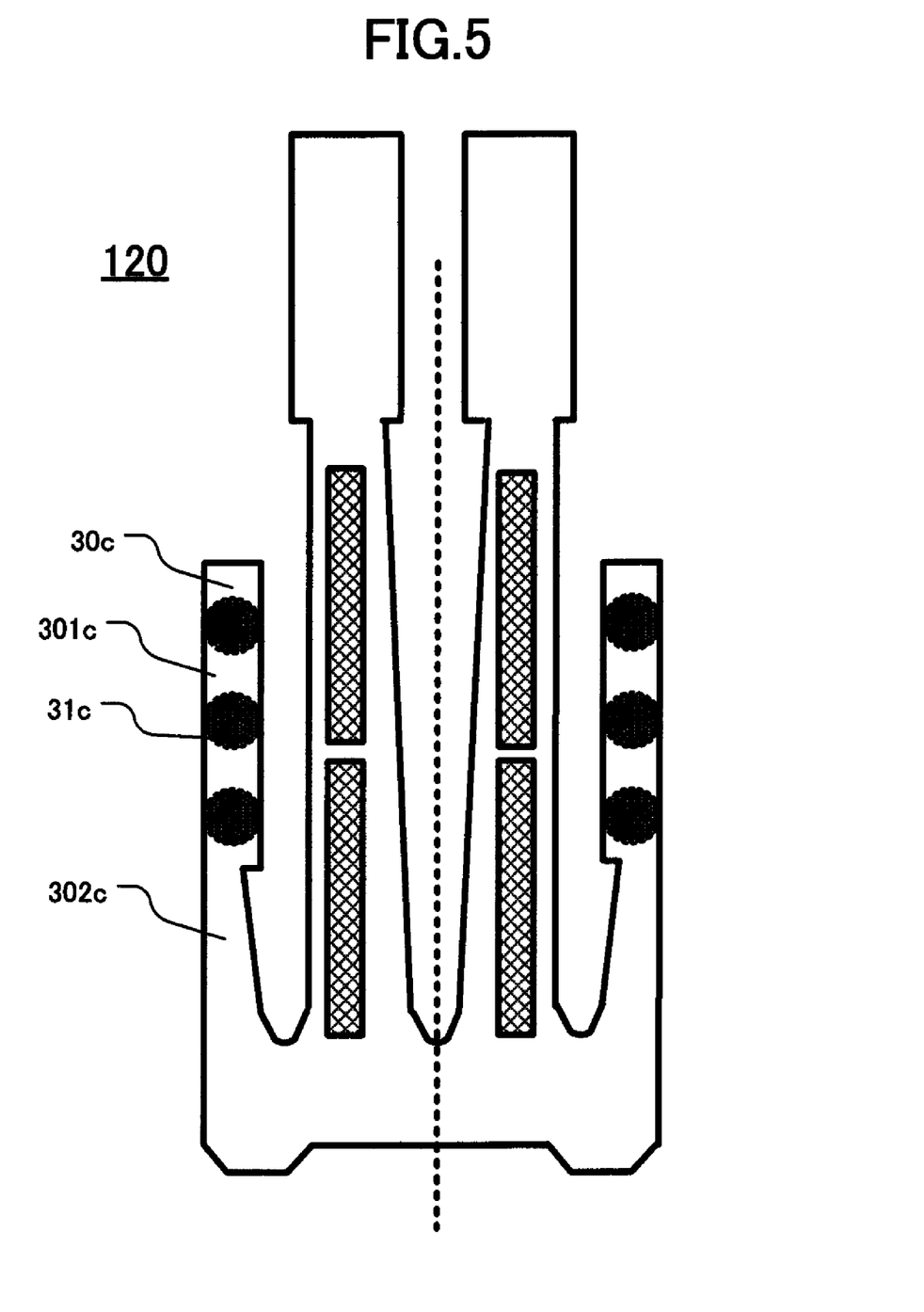
FIG. 5 is a schematic view of a third tuning-fork type piezoelectric vibrating piece 120 of a third embodiment.

FIG. 5 is a schematic view of a third tuning-fork type piezoelectric vibrating piece 120 which has low CI value increasing and oscillation leakage, and also having a improved ability to absorb physical impacts from dropping the package. The configuration except for the supporting arms 30c is not depicted since the configuration is the same as the first embodiment. Also, electrodes as well as the detailed configuration are not illustrated for convenience.

The supporting arms 30c of a third tuning-fork type piezoelectric vibrating piece 120 comprise arm portions 302c and hammer-head portions 301c in the Y-direction. As shown in FIG. 5, outer sides of the arm portions 302c are formed parallel and inner sides are sloped and become narrower along the Y-direction. Because of the shape, the oscillation leakage does not reach the supporting arms 30c.

Note that the hammer-head portions 301c become suddenly wider than the width of arm portions 302c. Three of the connecting portions 31c are evenly arranged on each of the hammer-head portions 301c. The third tuning-fork type piezoelectric vibrating piece 120 of the present embodiment is also formed symmetric with the center line. Because the arm portions 302c are formed wide at the root area and the hammer-head portions 301 are formed wide at the distal end, oscillation leakage or temperature change effects can be prevented. Because the connecting portions are arranged distantly from the base portion and the arm portions 302c become wider at the root area, stress changes caused by temperature changes at the connecting portions and effects on the flexure vibration of vibrating arms can be prevented.

In the third embodiment, as well as the first embodiment, a piezoelectric device can be manufactured by controlling frequency after the second tuning-fork type piezoelectric vibrating piece 110 is contained in a package PKG.

While preferred embodiments and examples of the current invention have been described above, it will be understood by those skilled in the art that additional modifications and changes can be made to the embodiments and examples without departing from the spirit of the invention. For example, crystal is used for the piezoelectric vibrating piece for present invention, but other piezoelectric single crystal materials such as lithium niobate can be used instead.

What is claimed is:

1. A piezoelectric vibrating piece comprising:
    a base portion formed of a piezoelectric material; and
    a pair of vibrating arms extending from one end of the base portion in a designated direction,
    each vibrating arm comprising an arm portion and a distal hammer-head portion,
    each arm portion having an outer edge and an inner edge, wherein only the inner edge is sloped relative to the outer edge so that the arm portion progressively narrows in width with increasing distance from the end of the base portion to a distal end of the arm portion,
    the hammer-head portion extending in the designated direction from the distal end of the arm portion and being wider than the distal end of the arm portion.

2. The piezoelectric vibrating piece of claim 1, wherein each hammer-head portion has a designated uniform width in the designated direction.

3. The piezoelectric vibrating piece of claim 2, wherein:
    each hammer-head portion is 1 micrometer to 100 micrometers wider than the width of the distal end of the respective arm portion; and
    the inner edge of each arm portion is sloped so that the distal end of the respective arm portion is 5% to 20% narrower than a maximum width of the arm portion.

4. The piezoelectric vibrating piece of claim 2, further comprising a pair of supporting arms extending from one end of the base portion in the designated direction, wherein:

each supporting arm is located outboard of the respective vibrating arm, each vibrating arm has a respective root portion by which the vibrating arm is attached to the base, each vibrating arm has a length in the designated direction, each supporting arm includes three connecting portions along the designated direction, a first connecting portion adjacent to the base portion is arranged at a position that is more than 15% of the vibrating-arm length away from the root portion of the respective vibrating arm, and the other two connecting portions are evenly spaced from the first connecting portion.

5. The piezoelectric vibrating piece of claim 4, wherein the respective three connecting portions on each supporting arm are evenly spaced along the designated direction.

6. The piezoelectric vibrating piece of claim 5, further comprising:

a respective supporting root portion situated between each vibrating arm and respective supporting arm; and a vibrating root portion situated between the vibrating arms, the vibrating root portion having substantially the same shape and size as each supporting root portion.

7. The piezoelectric vibrating piece of claim 6, wherein the supporting arms, the supporting root portion, the vibrating arms, and the vibrating root portion are symmetrical relative to a center line extending in the designated direction between the vibrating arms.

8. The piezoelectric vibrating piece of claim 4, further comprising:

a respective supporting root portion situated between each vibrating arm and respective supporting arm; and a vibrating root portion situated between the vibrating arms, the vibrating root portion having substantially the same shape and size as each supporting root portion.

9. The piezoelectric vibrating piece of claim 8, wherein the supporting arms, the supporting root portion, the vibrating arms, and the vibrating root portion are symmetrical relative to a center line extending in the designated direction between the vibrating arms.

10. The piezoelectric vibrating piece of claim 1, wherein:

each hammer-head portion is 1 micrometer to 100 micrometers wider than the width of the distal end of the respective arm portion; and the inner edge of each arm portion is sloped so that the distal end of the respective arm portion is 5% to 20% narrower than a maximum width of the arm portion.

11. The piezoelectric vibrating piece of claim 10, further comprising a pair of supporting arms extending from one end of the base portion in the designated direction, wherein:

each supporting arm is located outboard of the respective vibrating arm, each vibrating arm has a respective the vibrating arm is attached to the base portion, each vibrating arm has a length in the designated direction, each supporting arm includes three connecting portions along the designated direction, a first connecting portion adjacent to the base portion is arranged at a position that is more than 15% of the vibrating-arm length away from the root portion of the respective vibrating arm, and the other two connecting portions are evenly spaced from the first connecting portion.

12. The piezoelectric vibrating piece of claim 11, wherein the respective three connecting portions on each supporting arm are evenly spaced along the designated direction.

13. The piezoelectric vibrating piece of claim 1, further comprising a pair of supporting arms extending from one end of the base portion in the designated direction, wherein:

each supporting arm is located outboard of the respective vibrating arm, each vibrating arm has a respective root portion by which the vibrating arm is attached to the base portion, each vibrating arm has a length in the designated direction, each supporting arm includes three connecting portions along the designated direction, a first connecting portion adjacent to the base portion is arranged at a position that is more than 15% of the vibrating-arm length away from the root portion of the respective vibrating arm, and the other two connecting portions are evenly spaced from the first connecting portion.

14. The piezoelectric vibrating piece of claim 13, wherein the respective three connecting portions on each supporting arm are evenly spaced along the designated direction.

15. The piezoelectric vibrating piece of claim 14, further comprising:

a respective supporting root portion situated between each vibrating arm and respective supporting arm; and a vibrating root portion situated between the vibrating arms, the vibrating root portion having substantially the same shape and size as each supporting root portion.

16. The piezoelectric vibrating piece of claim 15, wherein the supporting arms, the supporting root portion, the vibrating arms, and the vibrating root portion are symmetrical relative to a center line extending in the designated direction between the vibrating arms.

17. The piezoelectric vibrating piece of claim 13, further comprising:

a respective supporting root portion situated between each vibrating arm and respective supporting arm; and a vibrating root portion situated between the vibrating arms, the vibrating root portion having substantially the same shape and size as each supporting root portion.

18. The piezoelectric vibrating piece of claim 17, wherein the supporting arms, the supporting root portion, the vibrating arms, and the vibrating root portion are symmetrical relative to a center line extending in the designated direction between the vibrating arms.

19. A piezoelectric device, comprising:

the piezoelectric vibrating piece of claim 1;

a lid covering the piezoelectric vibrating piece; and a package to which the supporting arms are connected, the package also supporting the piezoelectric vibrating piece.

20. A piezoelectric device, further comprising:

the piezoelectric vibrating piece of claim 1;

a lid covering the piezoelectric vibrating piece; and a package to which the supporting arms are connected, the package also supporting the piezoelectric vibrating piece.

* * * * *